US010974617B2

(12) United States Patent
Hiroe et al.

(10) Patent No.: US 10,974,617 B2
(45) Date of Patent: Apr. 13, 2021

(54) ELECTRIC POWER STORAGE SYSTEM

(71) Applicant: Toyota Jidosha Kabushiki Kaisha, Toyota (JP)

(72) Inventors: Yoshihiko Hiroe, Toyota (JP); Yoshitaka Niimi, Susono (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 124 days.

(21) Appl. No.: 16/251,700

(22) Filed: Jan. 18, 2019

(65) Prior Publication Data

US 2019/0225095 A1    Jul. 25, 2019

(30) Foreign Application Priority Data

Jan. 22, 2018  (JP) .............................. JP2018-008334

(51) Int. Cl.
| | |
|---|---|
| *B60L 58/19* | (2019.01) |
| *B60L 50/15* | (2019.01) |
| *H01M 10/44* | (2006.01) |
| *H01M 10/48* | (2006.01) |
| *G01R 31/382* | (2019.01) |

(Continued)

(52) U.S. Cl.
CPC ................ *B60L 58/19* (2019.02); *B60K 1/04* (2013.01); *B60L 3/0046* (2013.01); *B60L 50/15* (2019.02); *B60L 53/20* (2019.02); *B60L 58/15* (2019.02); *B60W 10/26* (2013.01); *G01R 31/382* (2019.01); *H01M 10/44* (2013.01);

(Continued)

(58) Field of Classification Search
CPC ....... H02J 7/0024; H02J 7/0047; B60L 50/15; B60L 53/20; B60L 58/19; G01R 31/382

USPC ................... 320/104, 107, 117, 120, 163
See application file for complete search history.

(56) References Cited

U.S. PATENT DOCUMENTS

| | | | |
|---|---|---|---|
| 6,034,506 A | * | 3/2000 | Hall .......................... H02J 7/35 320/117 |
| 6,781,343 B1 | | 8/2004 | Demachi et al. |

(Continued)

FOREIGN PATENT DOCUMENTS

| | | |
|---|---|---|
| DE | 102014004790 A1 | 10/2015 |
| EP | 3459786 A1 | 3/2019 |

(Continued)

OTHER PUBLICATIONS

Office Action dated Jul. 27, 2020 in U.S. Appl. No. 16/219,115.
Final Office Action dated Nov. 24, 2020 issued in U.S. Appl. No. 16/219,115, filed Dec. 13, 2018.

*Primary Examiner* — Richard Isla
*Assistant Examiner* — Aaron Piggush
(74) *Attorney, Agent, or Firm* — Dinsmore & Shohl LLP

(57) ABSTRACT

The electric power storage device of an electric power storage system includes plural electric power storage bodies and a switching relay. The switching relay is capable of being switched between a first state where the plural electric power storage bodies are connected in series, and a second state where the plural electric power storage bodies are connected in parallel. The switching relay allows each of the plural electric power storage bodies to be electrically disconnected from the rest of the electric power storage bodies. The control unit controls the switching relay into the all-off state where the plural electric power storage bodies are electrically disconnected from each other, when the main relay is in an opened state.

7 Claims, 12 Drawing Sheets

(51) Int. Cl.
*B60K 1/04* (2019.01)
*B60W 10/26* (2006.01)
*H02J 7/00* (2006.01)
*B60L 53/20* (2019.01)
*B60L 58/15* (2019.01)
*B60L 3/00* (2019.01)

(52) U.S. Cl.
CPC ........... *H01M 10/48* (2013.01); *H02J 7/0024* (2013.01); *H02J 7/0047* (2013.01)

(56) References Cited

U.S. PATENT DOCUMENTS

| | | |
|---|---|---|
| 7,692,404 B2 | 4/2010 | Harris |
| 9,731,619 B2 | 8/2017 | Tashiro et al. |
| 10,236,802 B2 | 3/2019 | Botts et al. |
| 10,305,298 B2 | 5/2019 | Kristensen |
| 10,427,547 B2 | 10/2019 | Syouda |
| 10,442,309 B2 | 10/2019 | Goetz |
| 10,630,086 B2 | 4/2020 | Hsu et al. |
| 10,661,679 B2 | 5/2020 | Botts et al. |
| 10,710,469 B2 | 7/2020 | Koerner et al. |
| 2012/0013180 A1 | 1/2012 | Muto et al. |
| 2012/0313584 A1 | 12/2012 | Sugiyama et al. |
| 2014/0210405 A1 | 7/2014 | Yang |
| 2014/0312828 A1* | 10/2014 | Vo et al. ............... H02J 7/0021 320/103 |
| 2016/0006377 A1 | 1/2016 | Hashimoto |
| 2017/0368958 A1 | 12/2017 | Eun |
| 2018/0037132 A1 | 2/2018 | Chen |
| 2018/0226905 A1 | 8/2018 | Botts et al. |
| 2019/0061551 A1 | 2/2019 | Knobel et al. |
| 2019/0089023 A1 | 3/2019 | Sastry et al. |
| 2019/0103750 A1 | 4/2019 | Kristensen |
| 2019/0126761 A1 | 5/2019 | Verbridge |
| 2019/0199108 A1 | 6/2019 | Hiroe et al. |
| 2019/0199248 A1 | 6/2019 | Botts et al. |
| 2019/0270391 A1 | 9/2019 | Kahnt et al. |
| 2020/0070667 A1 | 3/2020 | Wang et al. |
| 2020/0086761 A1 | 3/2020 | Hamada et al. |
| 2020/0185936 A1 | 6/2020 | Oishi et al. |
| 2020/0274370 A1* | 8/2020 | Krieg ................... H02J 7/0024 |

FOREIGN PATENT DOCUMENTS

| | | |
|---|---|---|
| EP | 3505391 A1 | 7/2019 |
| EP | 3514000 A1 | 7/2019 |
| JP | H03203501 A | 9/1991 |
| JP | 2007-098981 A | 4/2007 |
| JP | 2013-081316 A | 5/2013 |
| JP | 2016-013819 A | 1/2016 |
| WO | 2017186370 A1 | 11/2017 |

* cited by examiner ized as the "READY-OFF state"). That is, in
ELECTRIC POWER STORAGE SYSTEM

CROSS-REFERENCE TO RELATED APPLICATION

This application claims priority to Japanese Patent Application No. 2018-008334 filed on Jan. 22, 2018, incorporated herein by reference in its entirety.

BACKGROUND

1. Technical Field

The present disclosure relates to an electric power storage system capable of charging an electric power storage device mounted on a vehicle by using a power supply provided on the outside of the vehicle.

2. Description of Related Art

In Japanese Patent Application Publication No. 2013-81316 (JP 2013-81316 A), a vehicle that includes an electric power storage device configured to be charged by receiving electric power supplied from a power supply on the outside of the vehicle has been disclosed. The electric power storage device provided in the vehicle includes: plural battery packs; and a relay capable of being switched to ore of a fa it state where the plural battery packs are connected in series and a second state v the plural battery packs are connected in parallel. The state of the relay is switched on the basis of a temperature, a state of charge (SOC) or the like of the electric power storage device.

SUMMARY

Upon charging of the electric power storage device that is mounted on an electrically-driven vehicle (hereinafter also simply referred to as the "vehicle") such as an electric vehicle or a plug-in hybrid vehicle (hereinafter also referred to as "charging of the vehicle"), there is a case where a voltage diagnosis is made to diagnose whether a voltage between terminals is abnormal before initiation of charging.

In the vehicle disclosed in JP 2013-81316 A, the state of the relay is switched to the first state or the second state in accordance with a state of the electric power storage device. Thus, the state of the relay at the time of the voltage diagnosis is not determined. The voltage between the terminals of the electric power storage device is higher in the first state of the relay than that in the second state. In other words, the voltage between the terminals of the electric power storage device possibly varies in accordance with the state of the relay.

Accordingly, it is considered that a voltage range within which the voltage is diagnosed as normal in the voltage diagnosis (hereinafter also referred to as a "normal range") is set as a wide range that includes ranges of the voltage between the terminals in both of the first state and the second state. However, when the voltage range is set as the wide range, accuracy of the voltage diagnosis is possibly degraded.

The present disclosure improves accuracy of a voltage diagnosis that is made when an in-vehicle electric power storage device is charged by using a power supply on the outside of a vehicle.

An electric power storage system according to this disclosure includes: an electric power storage device configured to be charged by receiving electric power supplied from a power supply on the outside of a vehicle; a main relay provided between the electric power storage device and an electrical load of the vehicle; and a control unit that controls charging of the electric power storage device. The electric power storage device includes: plural electric power storage bodies; and a switching relay capable of being switched between a first state and a second state. The first state is a state where the plural electric power storage bodies are connected in series. The second state is a state where the plural electric power storage bodies are connected in parallel. The switching relay allows each of the plural electric power storage bodies to be electrically disconnected from the rest of the plural electric power storage bodies. The control unit brings the switching relay into an all-off state where the plural electric power storage bodies are electrically disconnected from each other when the main relay is in an opened state.

According to the above configuration, the plural electric power storage bodies are electrically disconnected from each other in the case where the main relay is in the opened state. When the main relay is in the opened state, the electric power cannot be supplied from the electric power storage device to the electrical load (a drive unit) of the vehicle. Thus, the vehicle is brought into a non-drivable state (hereinafter also referred to as a "READY-OFF state"). That is, in the READY-OFF state, the plural electric power storage bodies are electrically disconnected from each other. For this reason, a state of the switching relay before initiation of charging is set to the all-off state. Accordingly, before initiation of external charging to charge the electric power storage device by using the power supply on the outside of the vehicle, a voltage diagnosis can be made for each of the electric power storage bodies. That is to say, a voltage between terminals of each of the electric power storage body can be diagnosed. In addition, the diagnosed voltages do not include both the voltage between the terminals of the electric power storage body connected in series and the voltage between the terminals of the electric power storage body connected in parallel. Thus, a normal range can be set under the assumption that the voltage diagnosis is made for each of the electric power storage bodies. Just as described, the voltage diagnosis in the all-off state can be set as a precondition. Thus, accuracy of the voltage diagnosis can be improved. According to the present disclosure, it is possible to improve the accuracy of the voltage diagnosis at the time when the in-vehicle electric power storage device is charged by using the power supply on the outside of the vehicle.

The control unit may further bring the switching relay into the all-off state in the case where the main relay is in a closed state and a preparation operation is performed to charge the electric power storage device.

According to the above configuration, even when the main relay is in the closed state, the plural electric power storage bodies are disconnected from each other with the preparation operation for charging the electric power storage device being a trigger. Also, in this case, the accuracy of the voltage diagnosis can be improved as described above.

The electric power storage system may further include plural voltage sensors, each of which defects a voltage corresponding to one of the plural electric power storage bodies. The control unit may permit the electric power storage device to be charged by using the power supply in a case where, each of the voltages of the plural electric power storage bodies falls within a specified range when the switching relay is in the all-off state.

According to the above configuration, the voltage diagnosis is made in the all-off state. Thus, the specified range (the normal range) can be set under the assumption that the voltage diagnosis is made for each of the electric power storage bodies. In this way, an abnormal electric power storage body whose voltage between the terminals is out of the normal range can appropriately be detected. In addition, charging of the vehicle can be avoided when the abnormal electric power storage body is present.

The control unit may learn the voltages of the plural electric power storage bodies in the all-off state of the switching relay. The specified range may be defined by the learned voltages.

According to the above configuration, the specified range is defined by the voltage between the terminals of each of the plural electric power storage bodies that is learned when the switching relay is in the all-off state. Each of the learned voltages is not mixed with the voltage between the terminals of corresponding ones of the electric power storage bodies in another state of the switching relay. Thus, the voltages of the plural electric power storage bodies can be learned accurately. Therefore, the specified range can be set accurately.

The electric power storage system may further include plural voltage sensors, each of which detects a voltage corresponding to one of the plural electric power storage bodies. When, of the plural electric power storage bodies, an abnormal electric power storage body whose voltage does not fall within a specified range in the all-off state of the switching relay is present, the control unit may control the switching relay such that the abnormal electric power storage body is disconnected from the power supply, and may permit the electric power storage device to be charged by using the power supply.

According to the above configuration, in the case where, of the plural electric power storage bodies, the abnormal electric power storage body is present, the external charging is permitted in the state where the abnormal electric power storage body is disconnected from the power supply. In this way, even when of the plural electric power storage bodies, the abnormal electric power storage body is present, the external charging is not prohibited, and only the abnormal electric power storage body is disconnected to permit the external charging of the other electric power storage bodies.

When initiating charging of the electric power storage device by using the power supply, the control unit may bring the switching relay into the first state.

According to the above configuration, at the initiation of charging of the electric power storage device, the switching relay is brought into the first state. That is, the plural electric power storage bodies are connected in series. In the case where the plural electric power storage bodies are connected in series, the voltage between the terminals of the electric power storage device becomes higher than that in the case where the plural electric power storage bodies are connected in parallel. Accordingly, in the case where the vehicle is charged by supplying the same charging electric power in the state where the plural electric power storage bodies are connected in series, a charging voltage becomes higher than that in the case where the vehicle is charged in the state where the plural electric power storage bodies are connected in parallel. Thus, a magnitude of a flowing current (a charging current) can be reduced. Therefore, charging efficiency can be improved by suppressing loss of the electric power that is resulted from heat generation by a cable, a component, or the like (hereinafter also referred to as a "current-carrying component") through which the flowing current flows during charging.

The electric power storage bodies may be secondary batteries. When, of the plural electric power storage bodies, the electric power storage body whose electric power storage amount is smaller than a prescribed value is present at the initiation of charging of the electric power storage device by using the power supply, the control unit may control the switching relay such that the electric power storage body whose electric power storage amount is smaller than the prescribed value is connected to the power supply and that the electric power storage body whose electric power storage amount is equal to or larger than the prescribed value is disconnected from the power supply.

When charging efficiency of a secondary battery (hereinafter also simply referred to as a "battery") is considered, it has been known that the charging efficiency thereof is increased as the electric power storage amount thereof is reduced. According to the above configuration, in the case where the battery whose electric power storage amount is smaller than the prescribed value is present, such a battery is connected to the power supply, and the battery whose electric power storage amount is equal to or larger than the prescribed value is disconnected from the power supply. In this way, the battery that can be charged at the high charging efficiency can be charged preferentially, and thus the charging efficiency can be improved. As the prescribed value, a value of the electric power storage amount with which the battery can be charged at the charging efficiency that is equal to or higher than certain charging efficiency.

BRIEF DESCRIPTION OF THE DRAWINGS

Features, advantages, and technical and industrial significance of exemplary embodiments of the disclosure will be described below with reference to the accompanying drawings, in which like numerals denote like elements and wherein.

DETAILED DESCRIPTION

Figure 1:
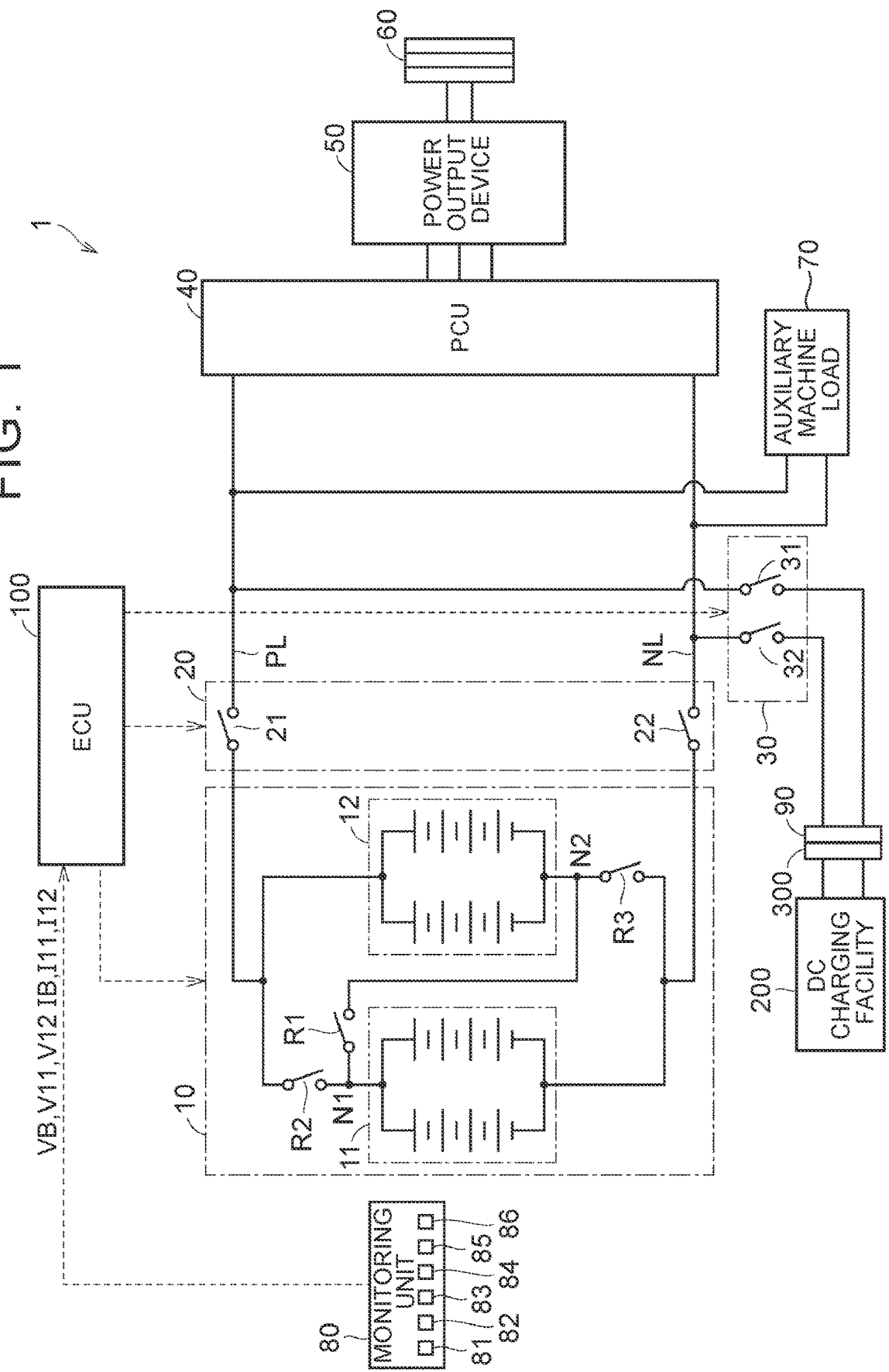
FIG. 1 is an overall configuration diagram of a charging system that includes a vehicle 1 and a DC charging facility according to this embodiment.

A detailed description will hereinafter be made on this embodiment with reference to the drawings. Note that the same or corresponding portions in the drawings are denoted by the same reference numerals and the description thereon will not be repeated.

FIG. 1 is an overall configuration diagram if a charging system that includes: a vehicle 1 on which an electric over storage system according to this embodiment is mounted; and a DC charging facility 200. With reference to FIG. 1, the vehicle 1 includes an electric power storage device 10, a power control unit (hereinafter also referred to as a "PCU") 40 a power output device 50, drive wheels 60, an auxiliary machine load 70, an inlet 90, an electronic control unit (ECU) 100, a main relay device 20, a charging relay device 30, and a monitoring unit 80.

The electric power storage device 10 includes two battery packs 11, 12 and switching relays R1, R2, R3. In the battery pack 11, plural batteries are stacked. Each of the batteries is a rechargeable DC power supply and is a secondary battery such as a nickel-metal hydrogen battery or a lithium-ion battery. Alternatively, each of the batteries may be a solid-state battery that includes solid electrolytes between a positive electrode and a negative electrode. The battery pack 11 stores electric power that is supplied from the DC charging facility 200 and received from the inlet 90, and also stores electric power generated by the power output device 50. The same configuration as the battery pack 11 is applied to the battery pack 12. Note that, in this embodiment, a description will be made on the example in which the electric power storage device 10 includes the two battery packs 11, 12; however, the number of the battery packs provided in the electric power storage device 10 is not limited to two. The number of the battery packs provided in the electric power storage device 10 may be three or more. In addition, each of the battery packs is not limited to the battery pack in which the plural batteries are stacked, and each of the battery packs may be configured to include the single battery. Furthermore, a capacitor of large capacitance can also be adopted for the battery packs 11, 12.

Each of the switching relays R1, R2, R3 can independently control opened/closed states thereof. In this embodiment, each of the switching relays R1, R2, R3 can be switched to any one of a first state, a second state, an all-off state, and a one-off state. The first state is a state where the two battery packs 11, 12 are connected in series. The second state is a state where the two battery packs 11, 12 are connected in parallel. The all-off state is a state where the two battery packs 11, 12 are electrically disconnected from each other. The one-off state is a state where both ends of one of the battery packs 11, 12 are electrically connected to the main relay device 20 but both ends of the other of tile battery packs 11, 12 are electrically disconnected from the main relay device 20.

The switching relay R2 is provided between a main relay 21 of the main relay device 20 and a positive electrode terminal of the battery pack 11. The switching relay R3 is provided between a main relay 22 of the main relay device 20 and a negative electrode terminal of the battery pack 12.

The switching relay R1 is provided between a node N1 and a node N2. The node N1 is provided between the switching relay R2 and the positive electrode terminal of the battery pack 11. The node N2 is provided between the switching relay R3 and the negative electrode terminal of the battery pack 12. The opened/closed state of each of the switching relays R1, R2, R3 in each of the first state, the second state, the all-off state, and the one-off state will be described later. Here, a transistor such as an insulated-gate bipolar transistor (IGBT) or a metal-oxide-semiconductor field-effect transistor (MOSFET), a mechanical relay, or the like is used for each of the switching relays R1, R2, R3.

Electric power converters used to receive electric power from the electric power storage device 10 and drive the power output device 50 are collectively illustrated as the PCU 40. For example, the PCU 40 includes: an inverter that drives a motor provided in the power output device 50; a converter that boosts the electric power output from the electric power storage device 10 and supplies the boosted electric power to the inverter: and the like.

Devices used to drive the drive wheels 60 are collectively illustrated as the power output device 50. For example, the power output device 50 includes the motor, an engine, and the like that drive the drive wheels 60. In addition, when the motor that drives the drive wheels 60 is operated in a regenerative mode, the power output device 50 generates the electric power during braking of the vehicle and outputs the generated electric power to the PCU 40. In the following description, the PCU 40, the power output device 50, and the drive wheels 60 will also collectively be referred to as a "drive unit". The drive unit is an electrical load of the vehicle 1.

The auxiliary machine load 70 is connected to a positive electrode line PL and a negative electrode line NL, each of which is connected to the electric power storage device 10. Auxiliary machines that are operated during external charging are collectively illustrated as the auxiliary machine toad 70. For example, the auxiliary machine load 70 includes a DC/DC converter that lowers a voltage of the positive electrode line PL and generates an auxiliary machine voltage; an electric air conditioner; and the like.

The inlet 90 can be connected to a charging connector 300 of the DC charging facility 200 that supplies DC power to the vehicle 1. During DC charging, the inlet 90 receives the electric power supplied from the DC charging facility 200.

The main relay device 20 is provided between the electric power storage device 10 and the drive unit. The main relay device 20 includes the main relay 21 and the main relay 22. The main relay 21 and the main relay 22 are connected to the positive electrode line PL and the negative electrode NL, respectively.

When both of the main relays 21, 22 are in an opened state, the electric power cannot be supplied from the electric power storage device 10 to the drive unit. Thus, the vehicle 1 is brought into a READY-OFF state where the vehicle 1 cannot travel. Meanwhile, when both of the main relays 21, 22 are in a closed state, the electric power can be supplied from the electric power storage device 10 to the drive unit. Thus, the vehicle 1 is brought into a READY-ON state where the vehicle 1 can travel.

The charging relay device 30 is connected between the main relay device 20 and the drive unit. The charging relay device 30 includes a charging relay 31 and a charging relay 32. One end of the charging relay 31 is connected to the positive electrode line PL, and the other end thereof is connected to the inlet 90. One end of the charging relay 32 is connected to the negative electrode line NL, and the other thereof is connected to the inlet 90. Both of the charging relays 31, 32 are brought into a closed state when the vehicle 1 is charged by using the DC charging facility 200.

When the main relays 21, 22 are brought into the closed state and the charging relays 31, 32 are brought into the closed state, a state where the electric power storage device 10 can be charged by using the DC charging facility 200 (hereinafter also referred to as an "external charging state") is realized.

Note that, in this embodiment, the charging relay device 30 is connected between the main relay device 20 and the drive unit; however, the charging relay device 30 may be connected between the electric power storage device 10 and the main relay device 20.

The monitoring unit 80 includes voltage sensors 81, 82, 83 and current sensors 84, 85, 86. The voltage sensor 81 detects a voltage VB between terminals of the electric power storage device 10 and outputs a detection value to the ECU 100. The voltage sensor 82 detects a voltage V11 between terminals of the battery pack 11 and outputs a detection value to the ECU 100. The voltage sensor 83 detects a voltage V12 between terminals of the battery pack 12 and outputs a detection value to the ECU 100.

The current sensor 84 detects a current 113 flowing through the electric power storage device 10 and outputs a detection value to the ECU 100. More specifically, the current sensor 84 detects: a charging current that is supplied from the DC charging facility 200 to charge the electric power storage device 10; and a discharging current that is supplied from the electric power storage device 10 to the drive unit and the like. The current sensor 85 detects a current 111 flowing through the battery pack 11 and outputs a detection value to the ECU 100. The current sensor 86 detects a current 112 flowing through the battery pack 12 and outputs a detection value to the ECU 100.

The ECU 100 includes a central processing unit (CPU), memory, and input/output buffer, none of which are shown, receives a signal from each of the sensors, outputs a control signal to each device, and controls each of the devices. Note that these types of the control are not only processed by software but can also be processed by building dedicated hardware (an electronic circuit).

More specifically, the ECU 100 controls charging of the electric power storage device 10. The ECU 100 switches the state of each of the switching relays R1, R2, R3 to one of the first state, the second state, the all-off state, and the one-off state by controlling opening/closing of the switching relays R1, R2, R3 provided in the electric power storage device 10. In addition, the ECU 100 controls opening/closing of the main relays 21, 22 provided in the main relay device 20. Furthermore, the ECU 100 controls opening/closing of the charging relays 31, 32 provided in the charging relay device 30.

The ECU 100 performs predetermined calculation by using the detection values acquired from the monitoring unit 80 and executes various types of processing. More specifically, for example, the ECU 100 learns the voltages V11, V12 between the terminals of the battery packs 11, 12 in the all-off state of the switching relays R1, R2, R3, and makes a voltage diagnosis, which will be described below, of the battery packs 11, 12 by using the learned values. In addition, the ECU 100 stores the detection values acquired from the monitoring unit 80. Note that the ECU 100 according to this embodiment corresponds to one example of the "control unit" according to the present disclosure.

The DC charging facility 200 supplies charging electric power (DC) to the vehicle 1 via the charging connector 300.

The DC charging facility 200 according to this embodiment can change a magnitude of a supply voltage (a charging voltage) when supplying the same charging electric power. For example, when supplying the same charging electric power, the DC charging facility 200 can supply the charging electric power at a high voltage (for example, 800 V) or can supply the charging electric power at a low voltage (for example, 400 V) in accordance with a request from the vehicle 1.

More specifically, as one example, the DC charging facility 200 supplies the charging electric power of 160 kW. In such a case, the DC charging facility 200 supplies the charging electric power of 800 V-200 A when the electric power storage device 10 of the vehicle 1 can be charged at 800 V. The DC charging facility 200 supplies the charging electric power of 400 V-400 A when the electric power storage device 10 of the vehicle 1 can be charged at 400 V. In a specification of the DC charging facility 200 in the above example, the maximum charging electric power is 160 kW, the maximum charging voltage is 800 V, and the maximum charging current is 400 A.

In this embodiment, as one example, the DC charging facility 200 performs the DC charging by supplying the charging electric power (for example, of 160 kW) equal to or higher than certain electric power. However, the DC charging facility 200 can supply any of various magnitudes of the charging electric power. Note that the DC charging performed by supplying the charging electric power equal to or higher than the certain electric power will also be referred to as "rapid charging".

Figure 2:
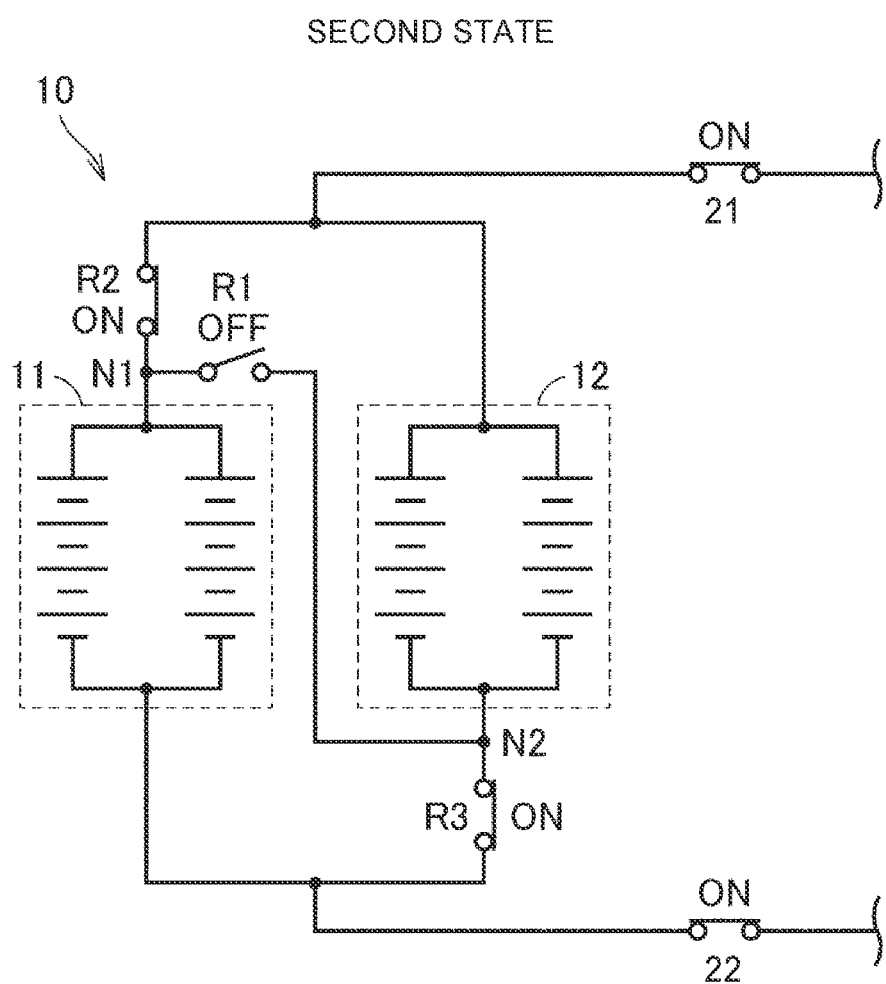
FIG. 2 is a schematic diagram of an electric power storage device at the time when switching relays are in a second state.

FIG. 2 is a schematic diagram of the electric power storage device 10 at the time when the switching relays R1, R2, R3 are in the second state. As shown in FIG. 2, the battery pack 11 and the battery pack 12 are connected in parallel when the switching relay R1 is brought into the opened state, and the switching relays R2, R3 are brought into the closed state.

Figure 3:
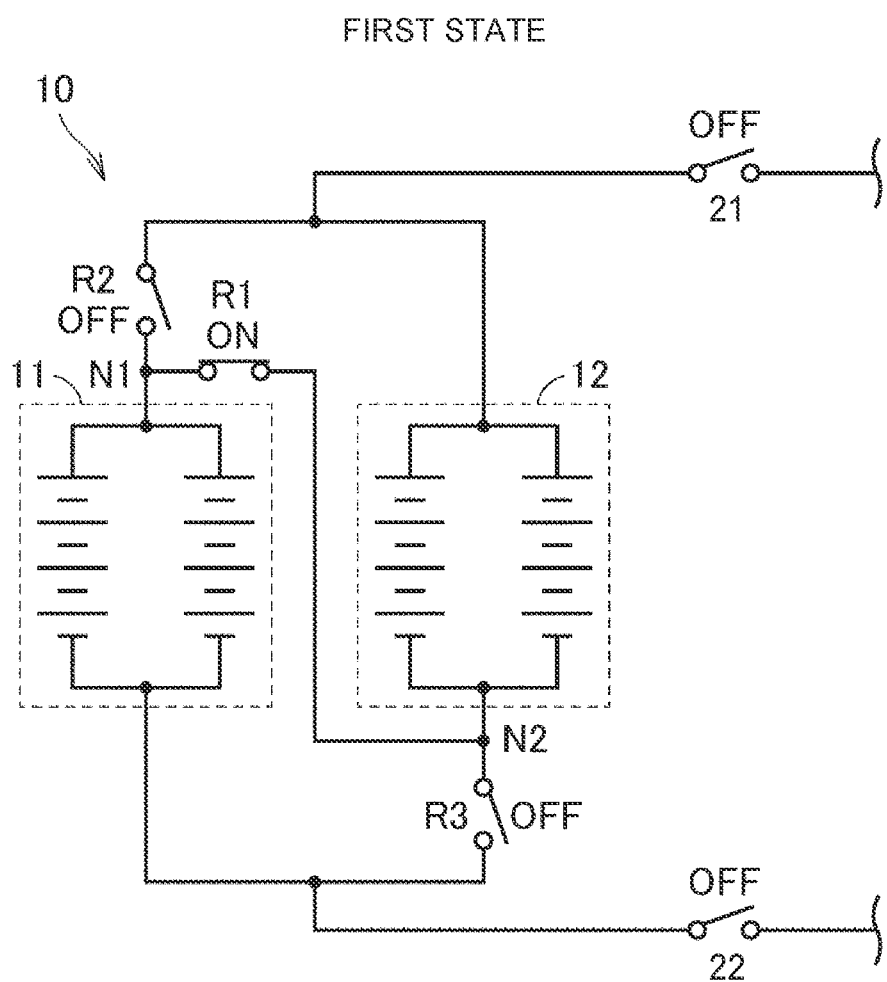
FIG. 3 is a schematic diagram of the electric power storage device at the time when the switching relays are in a first state.

FIG. 3 is a schematic diagram of the electric power storage device 10 at the time when the switching relays R1, R2, R3 are in the first state. As shown in FIG. 3, the battery pack 11 and the battery pack 12 are connected in series when the switching relay R1 is brought into the closed state, and the switching relays R2, R3 are brought into the opened state.

Figure 4:
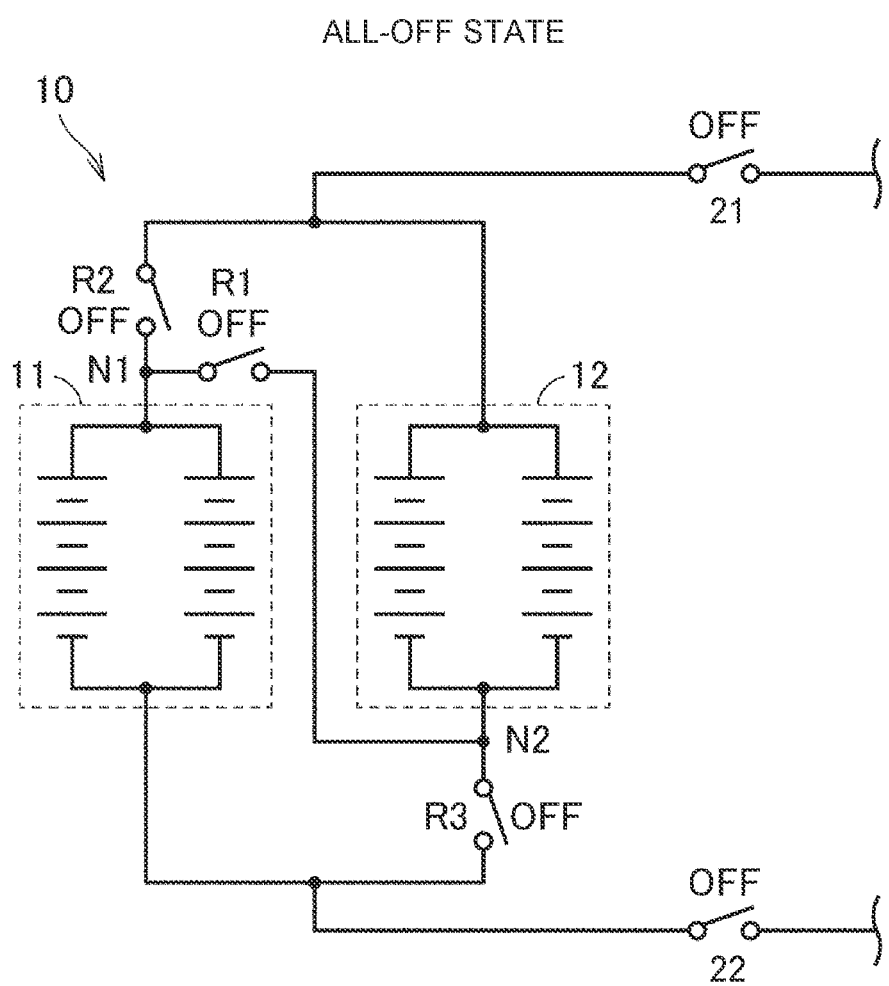
FIG. 4 is a schematic diagram of the electric power storage device at the time when the switching relays are in an all-off state.

FIG. 4 is a schematic diagram of the electric power storage device 10 at the time when the switching relays R1, R2, R3 are in the all-off state. As shown in FIG. 4, the battery pack 11 and the battery pack 12 are electrically disconnected from each other when the switching relays R1, R2, R3 are brought into the opened state.

Figure 5:
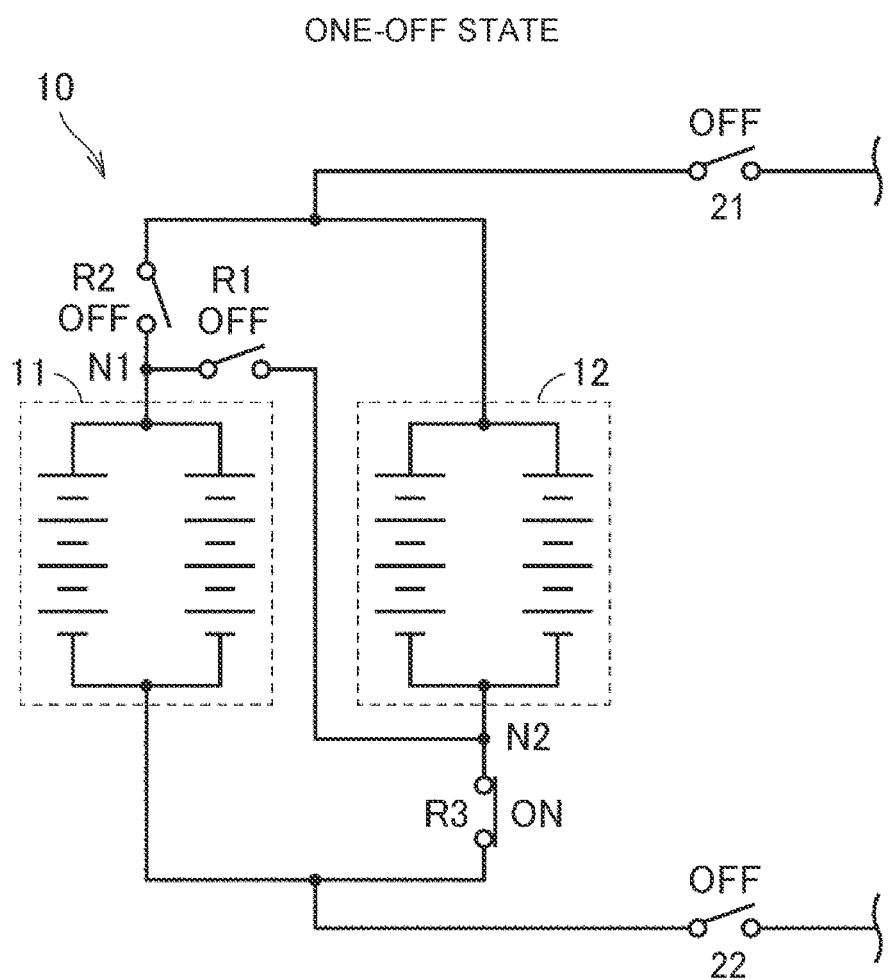
FIG. 5 is a schematic diagram of the electric power storage device at the tine when the switching relays are in a one-off state.

FIG. 5 is a schematic diagram of the electric power storage device 10 at the time when the switching relays R1, R2, R3 are in the one-off state. As one example, FIG. 5 shows the one-off state in the case where both of the ends of the battery pack 11 are electrically disconnected from main relay device 20 and both of the ends of the battery pack 12 are electrically connected to the main relay device 20. As shown in FIG. 5, only both of the ends of the battery pack 12 are electrically connected to the main relay device 20 when the switching relays R1, R2 are brought into the opened state, and the switching relay R3 is brought into the closed state.

Although not shown, in the one-off state where both of the ends of the battery pack 12 are electrically disconnected from the main relay device 20 and both of the ends of the battery pack 11 are electrically connected to the main relay device 20, only both of the ends of the battery pack 11 are electrically connected to the main relay device 20 when the switching relays R1, R3 are brought into the opened state, and the switching relay R2 is brought into the closed state.

Upon charging of the vehicle 1, there is a case where the voltage diagnosis is made to diagnose whether the voltage between the terminals of the electric power storage device 10 is abnormal before the initiation of charging.

In the case where the state of none of the switching relays R1 R2, R3 is determined during the voltage diagnosis, the voltage between the terminals of the electric power storage device 10 possibly contains the voltage between the terminals in the plural states of the switching relays R1, R2, R3. As a result, the voltage between the terminals of the electric power storage device 10 possibly varies.

Accordingly, it is considered that a voltage range (a normal range) within which the voltage is diagnosed as normal in the voltage diagnosis is set as a wide range that includes voltage ranges of the voltage between the terminals in the plural states of the switching relays R1, R2, R3. However, when the voltage range is set as the wide range, itis anticipated that accuracy of the voltage diagnosis is degraded.

In view of the above, when both of the main relays 21, 22 are in the opened state, the electric power storage system according to this embodiment brings the switching relays R1, R2, R3 into the all-off state. In this way, in the READY-OFF state, the switching relays R1, R2, R3 are fixed in the all off state. Thus, when the voltage diagnosis is made in the READY-OFF state, the state of each of the switching relays R1, R2, R3 is fixed to the all-off state. Accordingly, the voltage diagnosis can be made to diagnose the voltage between the terminals of each of the battery packs 11, 12, and the normal range can be set under the assumption that the voltage diagnosis is made for each of the battery packs 11, 12. Just as described, the voltage diagnosis in the all-off state can be set as a precondition. Thus, compared to the case where the state of none of the switching relays R1, R2, R3 is determined upon the voltage diagnosis, the accuracy of the voltage diagnosis can be improved.

In addition, since the voltage diagnosis is made for each of the battery packs 11,, 12, it is possible to identify an abnormal battery whose voltage between the terminals is out of the normal range. Furthermore, the switching relays R1, R2, R3 can be brought into the all-off state. Thus, when the abnormal battery is present, the battery pack can be replaced per pack unit.

When charging of the vehicle 1 is initiated, the switching relays R1, R2, R3 are brought into the first state (the battery packs 11, 12 are connected in series). In the case where the battery packs 11, 12 are connected in series, the voltage VB between the terminals of the electric power storage device 10 becomes higher than that in the case where the battery packs 11, 12 are connected in parallel. Accordingly, in the case where the vehicle 1 is charged by supplying the same charging electric power in the state where the battery packs 11, 12 are connected in series, the charging voltage becomes higher than that in the case where the vehicle 1 is charged in the state where the battery packs 11, 12 are connected in parallel. Thus, a magnitude of a flowing current can be reduced. As a result, when the vehicle 1 is charged in the first state, a current-carrying component of the vehicle 1 generates less heat than the case where the vehicle 1 is charged in the second state. Therefore, charging efficiency can be improved by suppressing loss of the electric power that is resulted from the heat generation by the current-carrying to component.

Figure 6:
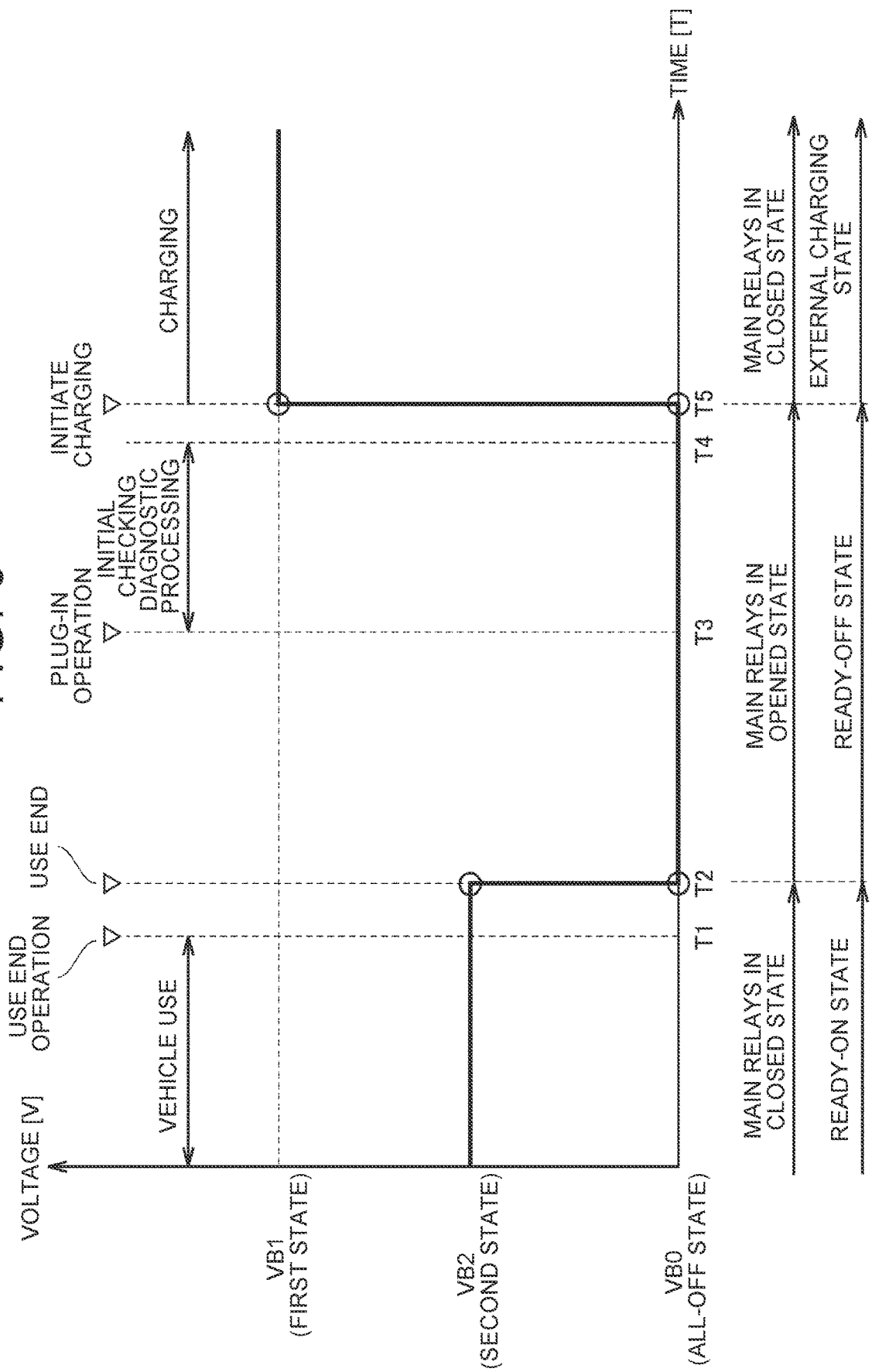
FIG. 6 is a timing chart (part 1) that shows a change in a voltage between terminals of the electric power storage device.

FIG. 6 is a timing chart that shows a change in the voltage VB between the terminals of the electric power storage device 10. In FIG. 6, a horizontal axis represents time, and a vertical axis represents the voltage. The "second state" indicated in the vertical axis represents a voltage VB2 between the terminals of the electric power storage device 10 at the time when the battery packs 11, 12 are connected in parallel. The "first state" represents a voltage VB1 between the terminals of the electric power storage device 10 at the time when the battery packs 11, 12 are connected in series. The "all off state" represents a voltage VB0 between the terminals of the electric power storage, device 10 at the time when the battery packs are disconnected from each other.

In an example shown in FIG. 6, the vehicle 1 is used (the main relays 21, 22 are in the closed state) until time T1. At the time T1, a use end operation of the vehicle 1 is performed. The use end operation is an operation that is performed for the vehicle 1 by a user in order to switch the vehicle 1 from the READY-ON state to the READY-OFF state.

In conjunction with the use end operation performed at the time T1 the main relays 21, 22 are brought into the opened state at time T2, and the switching relays R1, R2, R3 are switched from the second state to the all-off state.

Just as described, when the main relays 21, 22 are brought into the opened state, that is, the vehicle 1 is brought into the READY-OFF state in conjunction with the use end operation, the switching relays R1, R2, R3 are brought into the all-off state.

At time T3, a plug-in operation is performed to connect the charging connector 300 of the DC charging facility 200 to the inlet 90. Note that the plug-in operation according to this embodiment corresponds to one example of the "preparation operation for charging" according to the present disclosure. Other examples of the preparation operation for charging are an operation to open a charging lid (not shown) that covers the inlet 90 and an operation to unlock the charging lid when the charging lid has a lock function.

When the plug-in operation is performed, in a period between the time T3 and time T4, initial checking and diagnostic processing of the electric power storage device 10 are executed. The initial checking is processing to check whether charging can be performed normally. The diagnostic processing is processing to diagnose whether the electric power storage device 10 is normal. In this embodiment, as the diagnostic processing, the voltage diagnosis and a discharge diagnosis are made.

Since the state of each of the switching relays R1, R2, R3 is fixed to the all-off state in the READY-OFF state, the diagnostic processing of the electric power storage device 10 is executed in the all-off state. Thus, the diagnostic processing is executed for each of the battery packs 11, 12. Just as described, the battery packs 11, 12 are set in advance to be electrically disconnected from each other during the diagnostic processing. Thus, the diagnostic processing can be executed for each of the battery packs 11, 12. A detailed description on the initial checking and the diagnostic processing will be made later.

In conjunction with completion of the initial checking and the diagnostic processing of the electric power storage device 10 at the time T4, at time T5, the switching relays R1, R2, R3 are switched from the all-off state to the first state, and charging of the vehicle 1 is initiated.

The voltage VB1 between the terminals of the electric power storage device 10 in the first state is higher than the voltage VB2 between the terminals of the electric power storage device 10 in the second state (VB1>VB2). Accordingly, in the case where the vehicle 1 is rapidly charged by supplying the same charging electric power, the charging voltage for rapid charging in the first state is higher than the charging voltage for rapid charging in the second state. Thus, the magnitude of the flowing current can be reduced. Therefore, the charging efficiency can be improved by suppressing the loss of the electric power that is resulted from the heat generation by the current-carrying component.

Figure 7:
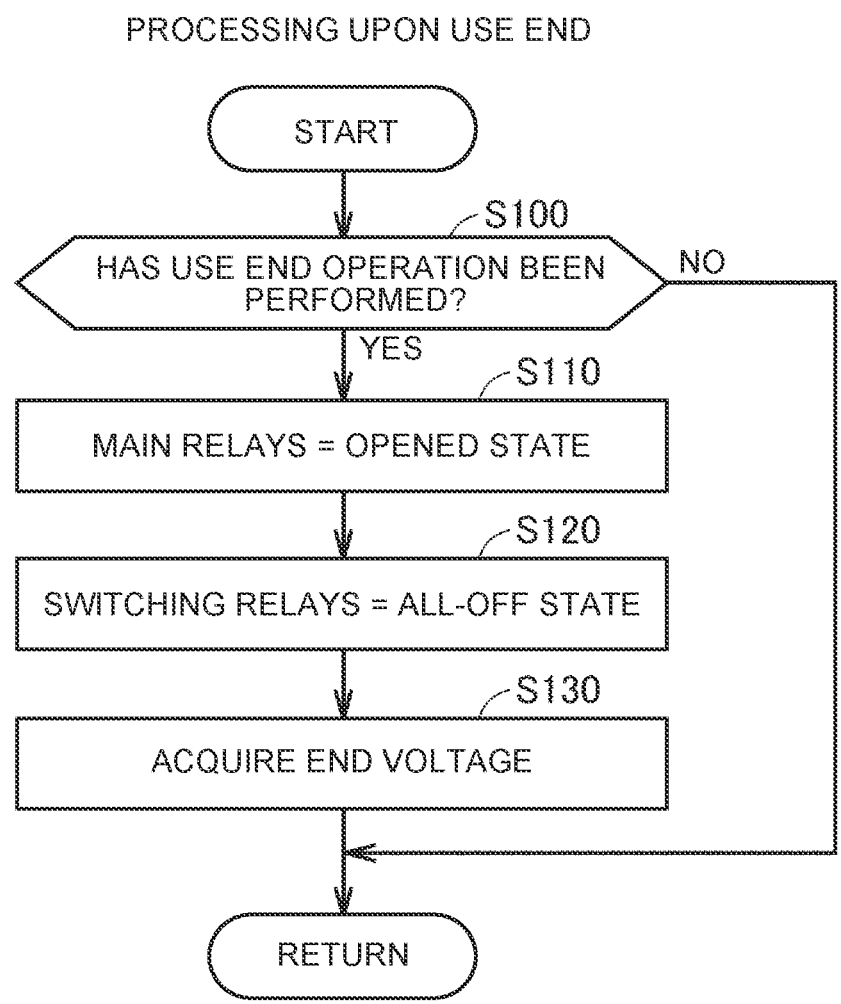
FIG. 7 is a flowchart of processing that is executed by an ECU in a period from use of the vehicle to use end of the vehicle.

FIG. 7 is a flowchart of processing that is executed by the ECU 100 in a period from use of the vehicle 1 to the use end of the vehicle 1. This processing is repeatedly executed by the ECU 100 when the vehicle 1 is switched from the READY-OFF state to the READY-ON state. Note that each step in the flowchart shown in FIG. 7 is realized when the ECU 100 processes software; however, some of the steps may be realized by the hardware (the electronic circuit) that is built in the ECU 100. The same applies to FIG. 8, FIG. 10, and FIG. 12.

The ECU 100 initiates the processing when the vehicle 1 is switched from the READY-OFF state to the READY-ON state. The ECU 100 determines whether the use end operation of the vehicle 1, specifically, an operation to switch the vehicle 1 to the READY-OFF state has been operated (step 100, hereinafter step will be abbreviated as "S").

If the ECU 100 determines that the use end operation has not been performed (NO in S100), the processing returns.

On the other hand, if the ECU 100 determines that the use end operation has been performed (YES in S100), the ECU 100 brings the main relays 21, 22 into the opened state (S110). When the main relays 21, 22 are brought into the opened state, the electric power can no longer be supplied from the electric power storage device 10 to the drive unit, Thus, the vehicle 1 is brought into the READY-OFF state.

Next, the ECU 100 brings the switching relays R1, R2, R3 into the all-off state (S120). In this way, in the READY-OFF state, the switching relays R1, R2, R3 are brought into the all-off state. Thus, in the case where the plug-in operation is performed in the READY-OFF state of the vehicle 1, the switching relays 1, R2, R3 are in the all-off state during the initial checking and the diagnostic processing, each of which is executed before charging of the vehicle 1 is initiated.

The ECU 100 acquires and stores the voltage between the terminals (hereinafter also referred to as an "end voltage") of each of the battery packs 11, 12 at the use end of the vehicle 1 (S130). The end voltage is used to diagnose a self-discharge amount of each of the battery packs 11, 12, which will be described later.

Figure 8:
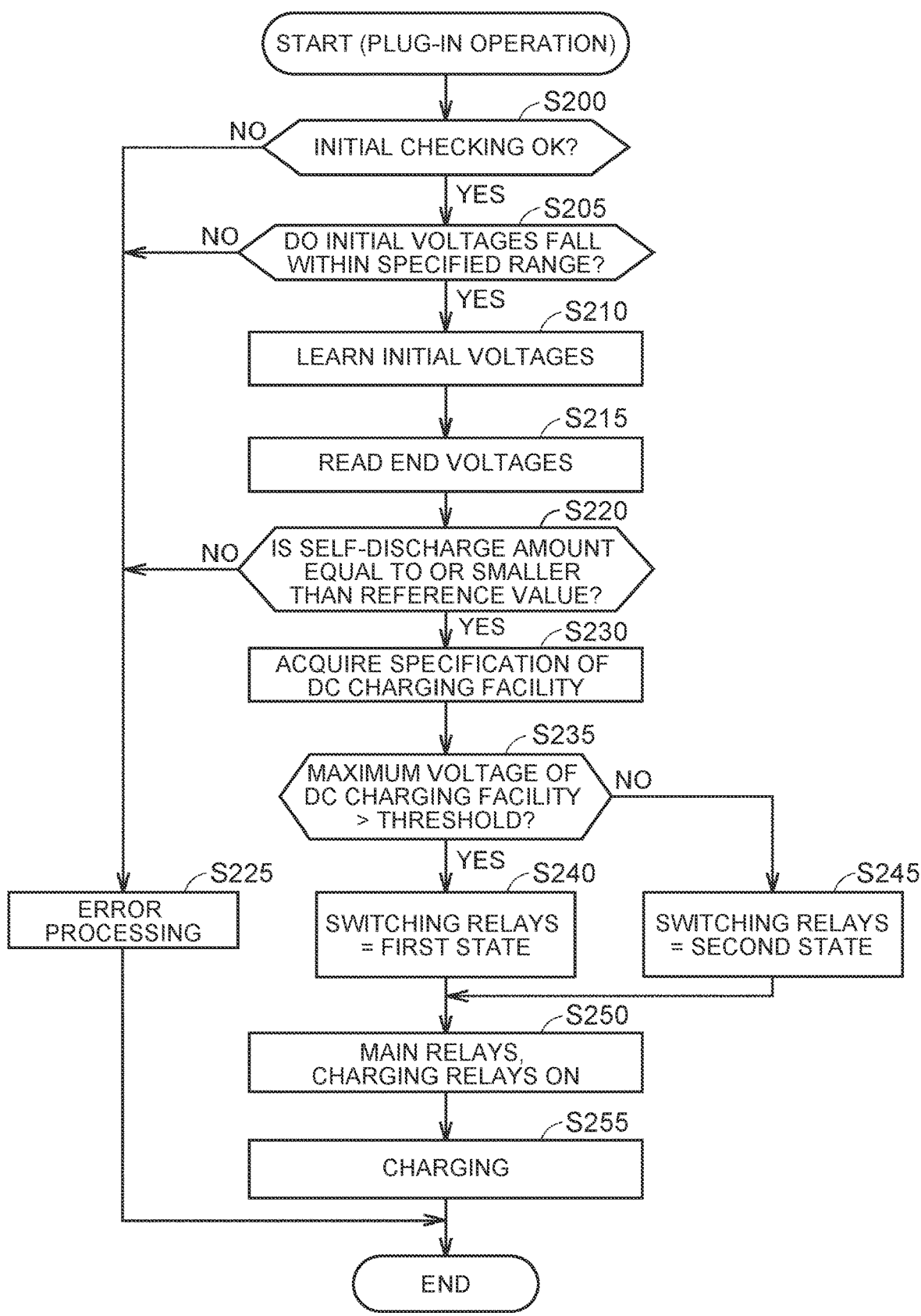
FIG. 8 is a flowchart (part 1) of processing that is executed by the ECU when a plug-in operation is performed.

FIG. 8 is a flowchart of processing that is executed by the ECU 100 when the plug-in operation is performed. This processing is executed every time the plug-in operation is performed. Note that the following description of FIG. 8 will be made on an example in which the plug-in operation is performed in the READY-OFF state of the vehicle 1.

When the plug-in operation, specifically, when the charging connector 300 of the DC charging facility 200 is connected to the inlet 90 of the vehicle 1, the ECU 100 executes the initial checking (S200). For example, the initial checking includes contact checking between the inlet 90 and the charging connector 300, self-checking of whether there is no electric failure in the vehicle 1, and the like.

If the ECU 100 determines that there is no abnormality in the initial checking (YES in S200), the ECU 100 makes the voltage diagnosis to diagnose the voltages V11, V12 between the terminals of the battery packs 11, 12. As the voltage diagnosis, the ECU 100 acquires the voltages V11, V12 between the terminals of the battery packs 11, 12 from the monitoring unit 80 and determines whether each of the voltages V11, V12 between the terminals falls within a specified range (S205). In the following description, the voltages V11, V12 between the terminals of the battery packs 11, 12 that are acquired in S205 will collectively be referred to as "initial voltages". In this embodiment, in the READY-OFF state, the switching relays R1, R2, R3 are in the all-off state. Thus, the switching relays R1, R2, R3 at the time of acquiring the initial voltages are in the all-off state. Since the state of each of the switching relays is set to the all-off state in advance, an appropriate specified range can be set with the assumption of the all-off state.

The ECU 100 acquires and stores values of each of the initial voltages (hereinafter also referred to as "learning") and defines the specified range by using an stored value of each of the initial voltages. The specified range in S205 is defined by the initial voltages that have been learned in the processing up to the last processing. In addition, the current initial voltages learned by the ECU 100 in S210, which will be described below, are reflected to the specified range used in S205 of the next processing. As a specific example of defining the specified range, the specified range is defined as follows. The ECU 100 learns the initial voltage of each of the battery packs 11, 12 per SOC at the time of acquiring the initial voltage. Then, the ECU 100 determines a certain range by using an average value of each of the learned initial voltages per the SOC and sets the certain range from the average value as the specified range. When the specified range is set by learning, just as described, an accurate range for each of the battery packs 11, 12 can be set as the specified range by considering an individual characteristic of each of the battery packs 11, 12. Note that a certain range from a fixed value per the SOC may be set as the specified range.

If the ECU 100 determines that each of the initial voltages falls within the specified range (YES in S205), the ECU 100 learns the initial voltages (S210).

Next, the ECU 100 reads the end voltages that are stored at the use end of the vehicle 1 (S215) and makes the discharge diagnosis to diagnose the self-discharge amount of each of the battery packs 11, 12 (S220). The discharge diagnosis is processing to diagnose the self-discharge amount of each of the battery packs 11, 12 in a resting period from the use end of the vehicle 1 to time at which charging of the vehicle 1 is initiated. As a specific example, the resting period is a period from the time T2 to the time T3 in FIG. 6.

In S220, as the discharge diagnosis, the ECU 100 determines whether a voltage drop amount per unit time by self-discharge is equal to or smaller than a a reference value. The voltage drop amount is expressed by the following formula (1), for example.

$$\text{Voltage drop amount} = (\text{end voltage} - \text{initial voltage}) / \text{resting period} \quad (1)$$

If the voltage drop amount is equal to or smaller than the reference value (YES in S220), the ECU 100 communicates with the DC charging facility 200 and acquires the specification of the DC charging facility 200 (S230). In this embodiment, as the specification of the DC charging facility 200, the maximum charging voltage that can be supplied by the DC charging facility 200 is acquired.

The ECU 100 determines whether the maximum charging voltage of the DC charging facility 200 is equal to or higher than a threshold (S235). The threshold is an arbitrarily set value between the voltage VB between the terminals of the electric power storage device 10 at the time when the battery packs 11, 12 are connected in series and the voltage VB between the terminals of the electric power storage device 10 at the time when the battery packs 11, 12 are connected in parallel. That is, the processing in S235 is executed to determine whether the maximum charging voltage of the DC charging facility 200 corresponds to a voltage at which the electric power storage device 10 can be charged in a state of the in-series connection of the battery packs 11, 12.

If the ECU 100 determines that the maximum charging voltage of the DC charging facility 200 is higher than the threshold (YES in S235), the ECU 100 switches the switching relays R1, R2, R3 to the first state (connects the battery packs 11, 12 in series) (S240), and the processing proceeds to S250.

If the ECU 100 determines that the maximum charging voltage of the DC charging facility 200 is equal to or lower than the threshold (NO in S235), the ECU 100 switches the switching relays R1, R2, R3 to the second state (connects the battery packs 11, 12 in parallel) (S245), and the processing proceeds to S250.

In S250, the ECU 100 brings the main relays 21, 22 and the charging relays 31, 32 into the closed state. Then, the ECU 100 initiates charging of the vehicle 1 (S255).

If the ECU 100 determines that there is an abnormality in the initial checking (NO in S200), if the ECU 100 determines that each of the initial voltages does not fall within the specified range (NO in S205), or if the ECU 100 determines that the voltage drop amount is not equal to or smaller than the reference value (NO in S220), the ECU 100 executes error processing (S225). For example, as the error processing, the ECU 100 executes processing to prohibit charging of the vehicle 1.

In addition, as the error processing that is executed when the ECU 100 determines that either one of the initial voltages does not fall within the specified range (NO in S205) or when the ECU 100 determines that the voltage drop amount is not equal to or smaller than the reference value (NO in S220), the ECU 100 may control the switching relays R1, R2, R3 so as to electrically disconnect the determined battery pack from the main relay device 20. For example, if the ECU 100 determines that the initial voltage of the battery pack 11 does not fall within the specified range (NO in S205), the ECU 100 brings the switching relays R1, R2 into the opened state and brings the switching relay R3 into the closed state. In this way, the battery pack 11 is electrically disconnected from the main relay device 20. As for the battery pack 12 whose initial voltage fails within the normal range, the subsequent processing is executed to allow charging of the vehicle 1.

As it has been described so far, in the case where the main relays 21, 22 are in the opened state, the electric power storage system according to this embodiment brings the switching relays R1, R2, R3 into the all-off state. In this way, in the READY-OFF state, the switching relays R1, R2, R3 are fixed in the all-off state. Accordingly, the state of each of the switching relays R1, R2, R3 in the diagnostic processing, which is executed before charging of the vehicle 1 is initiated, is fixed to the all-off state. Thus, the voltage diagnosis can be made to diagnose the voltage between the terminals of each of the battery packs 11, 12, and the normal range can be set under the assumption that the voltage diagnosis is made for each of the battery packs 11, 12. Just as described, the voltage diagnosis in the all-off state can be set as the precondition. Thus, compared to the case where the state of none of the switching relays R1, R2, R3 is determined in the voltage diagnosis, the accuracy of the voltage diagnosis can be improved.

In addition, since the voltage diagnosis is made for each of the battery packs 11, 12, it is possible to identify the abnormal battery whose voltage between the terminals is out of the normal range. Furthermore, the switching relays R1, R2, R3 can be brought into the all-off state. Thus, when the abnormal battery is present, the battery pack can be replaced per pack unit.

In addition, when charging of the vehicle 1 is initiated, the state of each of the switching relays R1, R2, R3 is brought into the first state. In the case where the battery packs 11, 12 are connected in series, the voltage VB between the terminals of the electric power storage device 10 becomes higher than that in the case where the battery packs 11, 12 are connected in parallel. Accordingly, in the case where the vehicle 1 is charged by supplying the same charging electric power in the state where the battery packs 11, 12 are connected in series, the charging voltage becomes higher than that in the case where the vehicle 1 is charged in the state where the battery packs 11, 12 are connected in parallel. Thus, the magnitude of the flowing current can be reduced. As a result, when the vehicle 1 is charged in the first state, the current-carrying component of the vehicle 1 generates less heat than the case where the vehicle 1 is charged in the second state. Therefore, charging efficiency can be improved by suppressing the loss of the electric power that is resulted from the heat generation by the current-carrying component, First Modified Example In the above embodiment, an electric power storage amount such as the SOC of each of the battery packs 11, 12 before the initiation of charging is not considered, and the states of the switching relays R1, R2, R3 at the initiation of charging are determined on the basis of a relationship with the maximum charging voltage of the DC charging facility 200 (more specifically, S235 to S245 in FIG. 8). However, the states of the switching relays R1, R2, R3 may be determined in consideration of the electric power storage amount such as the SOC of each of the battery packs 11, 12. In this way, as will be described below, the vehicle 1 can be charged at the high charging efficiency.

Figure 9:
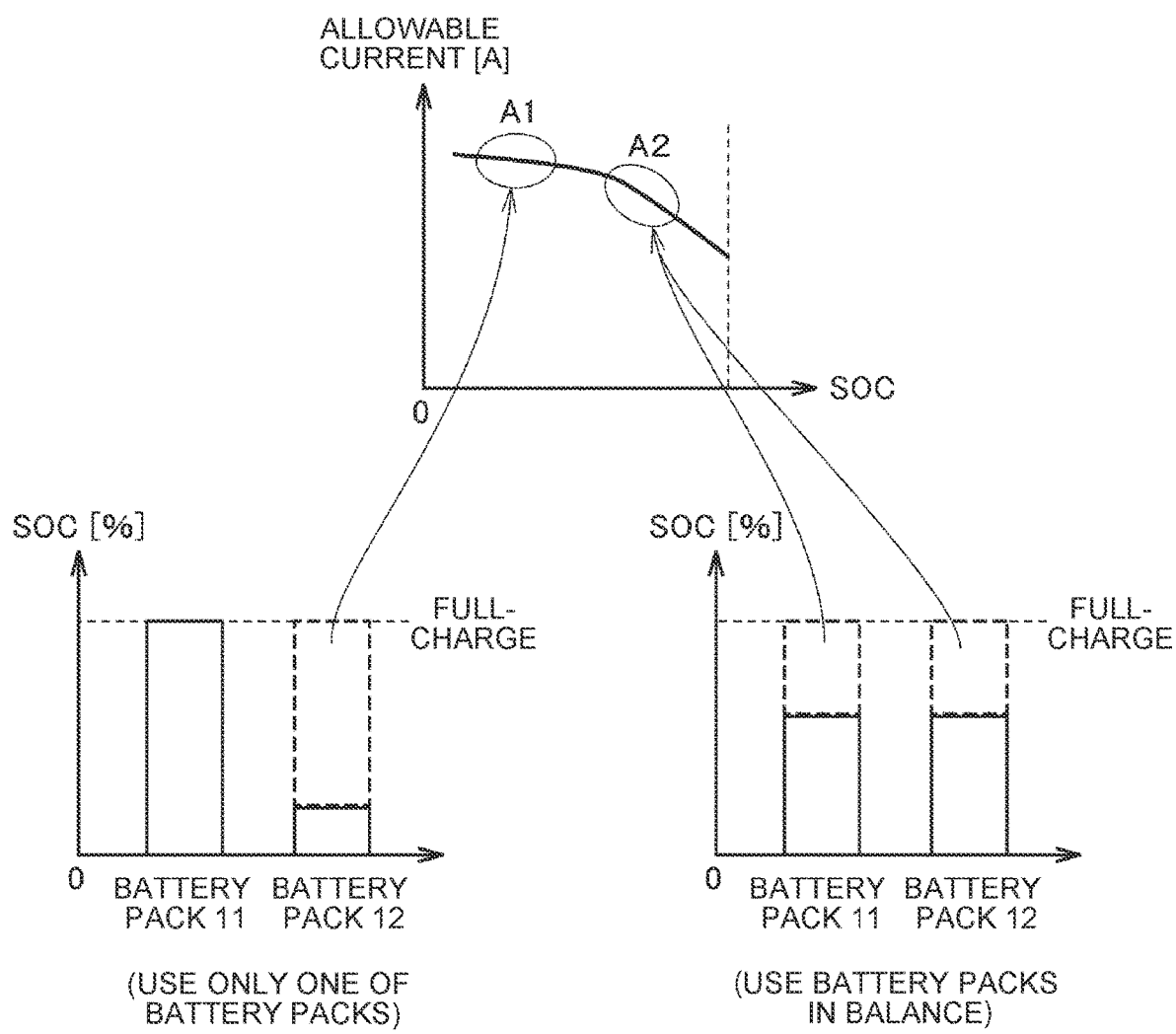
FIG. 9 includes graphs indicative of a relationship between a SOC of each battery pack and an allowable charging current.

FIG. 9 includes graphs indicative of a relationship between the SOC of each of the battery packs and an allowable charging current. In FIG. 9, a horizontal, axis of art upper graph represents the SOC of the battery packs, and a vertical axis represents the allowable charging current.

The graph in an upper section of FIG. 9 indicates that the large charging current is allowed in a low SOC region A1 and the small charging current is allowed in a high SOC region A2. Thus, in the case where a battery pack whose SOC is located in the region A1 is present, it is considered to switch the states of the switching relays R1, R2, R3 at the initiation of charging so as to allow such a battery pack to be charged preferentially. That is, the states of the switching relays R1, R2, R3 at the initiation of charging are switched in accordance with the SOC of each of the battery packs 11, 12.

In First Modified Example, a prescribed value is set to determine whether the batteries can be charged at the charging efficiency that is equal to or higher than a certain degree of the charging, efficiency. More specifically, when the SOC is lower than the prescribed value, the batteries are charged at the charging efficiency in the region A1 (at the high charging efficiency). On the other hand, when the SOC is equal to or higher than the prescribed value, the batteries are charged at the charging efficiency in the region A2 (at the low charging efficiency). The prescribed value is a value that is defined experimentally.

For example, as shown in the left graph in a lower section of FIG. 9, a situation where the battery pack 11 is fully charged and the SOC of the battery pack 12 is lower than the prescribed value is assumed. One example of such a situation is a case where the vehicle 1 travels for a short distance by disconnecting the battery pack 11 as one of the battery packs and using the battery pack 12 only in consideration of the later charging efficiency. In this case, the battery pack 12 can be charged at the charging efficiency in the region A1. Accordingly, the switching relays R1, R2, R3 are brought into the one-off state where both of the ends of the battery pack 11 are electrically disconnected from the main relay device 20 and both of the ends of the battery pack 12 are electrically connected to the main relay device 20, and only the battery pack 12 is charged. In this way, the charging efficiency can be improved.

Meanwhile, as shown in the right graph in the lower section of FIG. 9, in the case where both of the battery packs 11, 12 are used in balance and both of the battery packs 11, 12 can be charged at the charging efficiency in the region A2, it is assumed that the charging efficiency can be improved by charging both of the battery packs 11, 12.

Thus, in First Modified Example, the states of the switching relays R1, R2, R3 are switched in accordance with the SOC of each of the battery packs 11, 12 at the initiation of charging of the vehicle 1.

Figure 10:
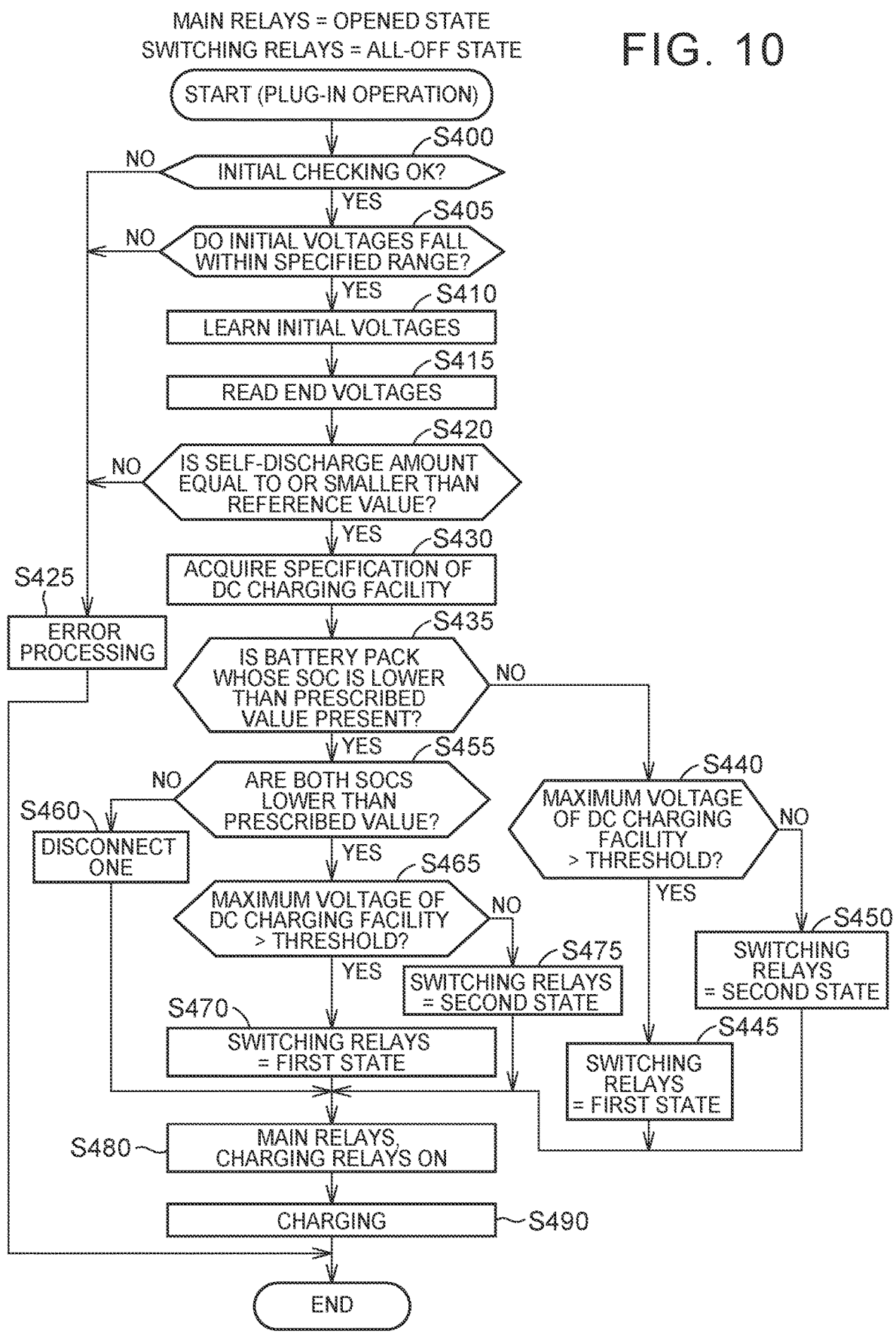
FIG. 10 is a flowchart (part 2) of processing that is executed b the ECU when the plug-in operation is performed.

FIG. 10 is a flowchart of processing that is executed by the ECU 100 when the plug-in operation is performed. This processing is executed every time the plug-in operation is performed for the vehicle 1. Because processing in S400 to S430 in FIG. 10 is the same as that in S200 to S230 in FIG. 8, the description thereon will not be made.

The ECU 100 determines whether the SOC of each of the battery pack 11 and the battery pack 12 is lower than the prescribed value (S435). Note that the ECU 100 calculates the SOCs by using the voltages V11, V12 between the terminals of the battery packs 11, 12, which are acquired from the monitoring unit 80. More specifically, due to a correlation between the SOC and an open circuit voltage (OCV), the ECU 100 can calculate the SOC by using the OCV (a voltage with no load) of each of the battery packs 11, 12. Alternatively, the ECU 100 may calculate a SOC of the electric power storage device 10 by integrating a charge/discharge amount. A known technique only has to be used to calculate the SOC, and thus a detailed description will not be made on the calculation of the SOC.

If the ECU 100 determines that the SOCs of both of the battery packs 11, 12 are equal to or higher than the prescribed value (NO in S435), the ECU 100 determines whether the maximum charging voltage of the DC charging facility 200 is higher than the threshold (S440).

If the ECU 100 determines that the maximum charging voltage of the DC charging facility 200 is higher than the threshold (YES in S440), the ECU 100 switches the switching relays R1, R2, R3 to the first state (S445), and the processing proceeds to S480.

If the ECU 100 determines that the maximum charging voltage of the DC charging facility 200 is equal to or lower than the threshold (NO in S440), the ECU 100 switches the switching relays R1, R2, R3 to the second state (S450), and the processing proceeds to S480.

If the ECU 100 determines that the SOC of at least one of the battery packs 11, 12 is lower than the prescribed value (YES in S435), the ECU 100 determines whether the SOCs of both of the battery packs 11, 12 are lower than the prescribed value (S455).

If the ECU 100 determines that the SOC of only one of the battery packs 11, 12 is equal to or higher than the prescribed value (NO in S455), the ECU 100 brings the switching relays R1, R2, R3 into the one-off state where both of the ends of the battery pack whose SOC is lower than the prescribed value are electrically connected to the main relay device 20 and both of the ends of the other battery pack are electrically disconnected from the main relay device 20 (S460). Then, the processing proceeds to S480.

If the ECU 100 determines that the SOCs of both of the battery packs 12 are lower than the prescribed value (YES in S455), the ECU 100 determines whether the maximum charging voltage of the DC charging facility 200 is higher than the threshold (S465).

If the ECU 100 determines that the maximum charging voltage of the DC charging facility 200 is higher than the threshold (YES in S465), the ECU 100 switches the switching relays R1, R2, R3 to the first state (S470), and tine processing proceeds to S480.

If the ECU 100 determines that the maximum charging voltage of the DC charging facility 200 is equal to or lower than the threshold (NO in S465), the ECU 100 switches the switching relays R1, R2, R3 to the second state (S475), and the processing proceeds to S480.

In S480, the ECU 100 brings the main relays 21, 22 and the charging relays 31, 32 into the closed state. Then, the ECU 100 initiates charging of the vehicle 1 (S490).

As it has been described so far, in First Modified Example, the states at the switching relays R1, R2, R3 are switched in accordance with the SOC of each of the battery packs 11, 12 at the initiation of charging. When the battery pack whose batteries can be charged at the charging efficiency equal to or higher than the certain degree of the charging efficiency is present, such a battery pack is charged preferentially. In this way, the charging efficiency of the electric power storage device 10 can be improved.

Second Modified Example

In the embodiment and First Modified Example, the description has been made on the example in which the plug-in operation is performed in the READY-OFF state. That is, the description has been made on the example in which the vehicle 1 is switched from the READY-OFF state to the external charging state by the plug-in operation. However, in the electrically-driven vehicle, the plug-in operation may be performed in the READY-ON state of the vehicle 1. That is, the vehicle 1 may be switched front the READY-ON state to the external charging state by the plug-in operation. In Second Modified Example, a description will be made on an example in which the plug-in operation is performed in the READY-ON state.

Figure 11:
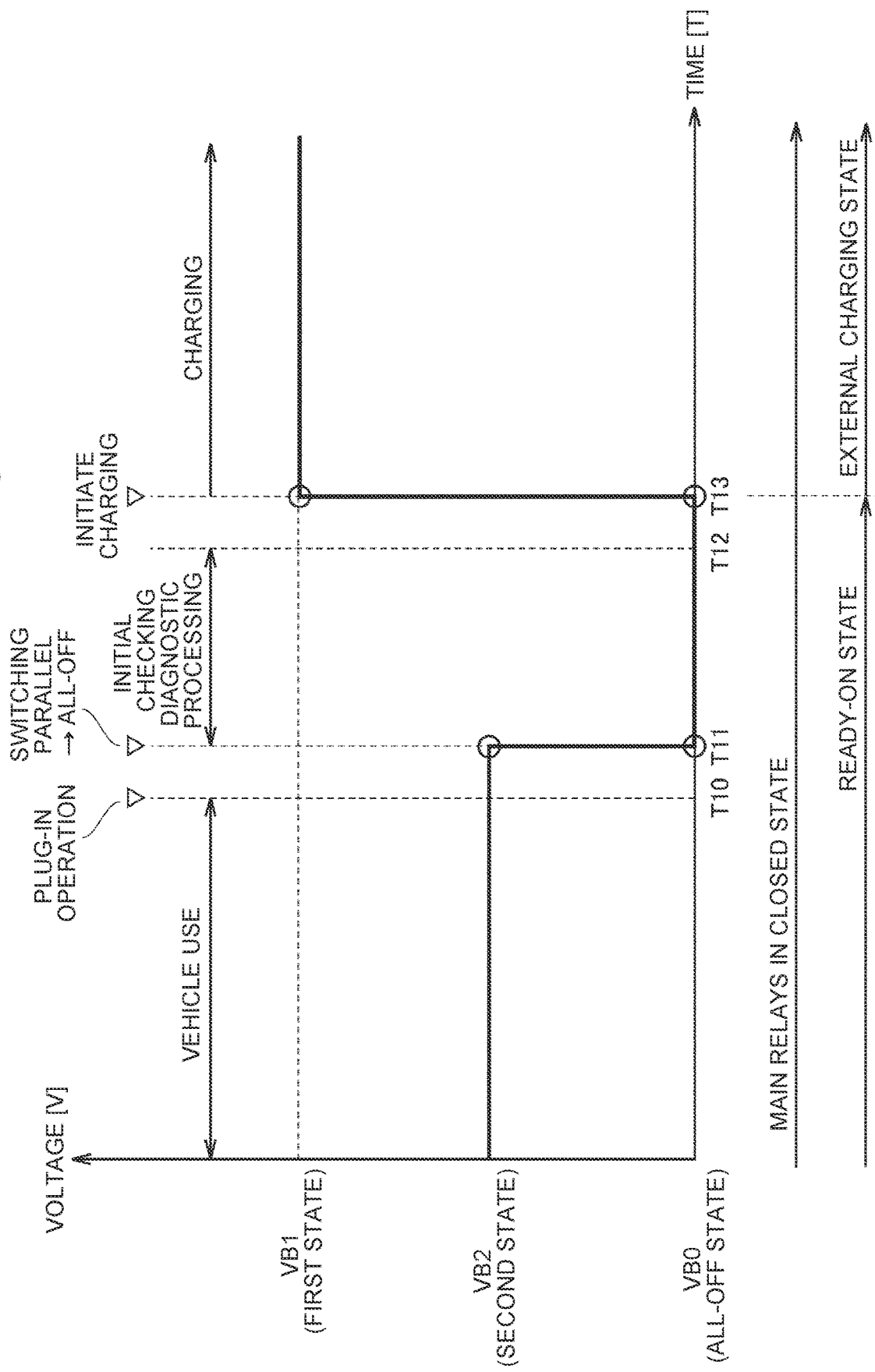
FIG. 11 is a timing chart (part 2) that shows the change in the voltage between the terminals of the electric power storage device.

FIG. 11 is a timing chart that shows the change in the voltage V13 between the terminals of the electric power storage device 10. In FIG. 11, a horizontal axis represents the time, and a vertical axis represents the voltage. The "second state" indicated in the vertical axis represents the voltage VB between the terminals of the electric power storage device 10 at the time when the battery packs 11, 12 are connected in parallel. The "first state" represents the voltage VB between the terminals of the electric power storage device 10 at the time when the battery packs 11, 12 are connected in series. The "all-off state" represents the voltage VB between the terminals of the electric power storage device 10 at the time when the battery packs 11, 12 are disconnected from each other.

In an example shown, in FIG. 11, the vehicle 1 is used (the main relays 21, 22 are in the closed state) until time T10. At the time T10, the plug-in operation is performed. More specifically, for example, a case where the plug-in operation is performed at the time T10 in a state where the vehicle 1 stops traveling and remains in the READY-ON state is assumed.

When the plug-in operation is performed at the time T10, with the plug-in operation being a trigger, the switching relays R1, R2, R3 area switched from the second state to the all-off state at time T11. Just as described, also in the case where the plug-in operation is performed in the READY-ON state, the switching relays R1, R2, R3 are switched to the all-off state. Note that, in the READY-ON state, the switching relays R1, R2, R3 are appropriately switched from the first state or the second state depending on a travel situation of the vehicle 1. Thus, in the READY-ON state, there is a case where the switching relays R1, R2, R3 are in the first state when the plug-in operation is performed. In such a case, similarly, the switching relays R1, R2, R3 are switched from the first state to the all-off state with the plug-in operation being the trigger.

Next, in a period between the time T11 and time T12, the initial checking and the diagnostic processing of the electric power storage device 10 are executed. The diagnostic processing of the electric power storage device 10 is executed in the all-off state of the switching relays R1, R2, R3. Just as described, the battery packs 11, 12 are set in advance to be electrically disconnected from each other during the diagnostic processing. Thus, the diagnostic processing can be executed for each of the battery packs 11, 12.

In conjunction with the completion of the initial checking and the diagnostic, processing of the electric power storage device 10 at the time T12, at time T13, the switching relays R1, R2, R3 are switched from the all-off state to the first state, and charging of the vehicle 1 is initiated.

The voltage VB1 between the terminals of the electric power storage device 10 in the first state is higher than the voltage VB2 between the terminals of the electric power storage device 10 in the second state (VB1>VB2). Accordingly, in the case where the vehicle 1 is rapidly charged by supplying the same charging electric power, the charging voltage for rapid charging in the first state is higher than the charging voltage for rapid charging in the second state. Thus, the magnitude of the flowing current can be reduced. Therefore, the charging efficiency can be improved by suppressing the loss of the electric power that is resulted from the heat generation by the current-carrying component.

Figure 12:
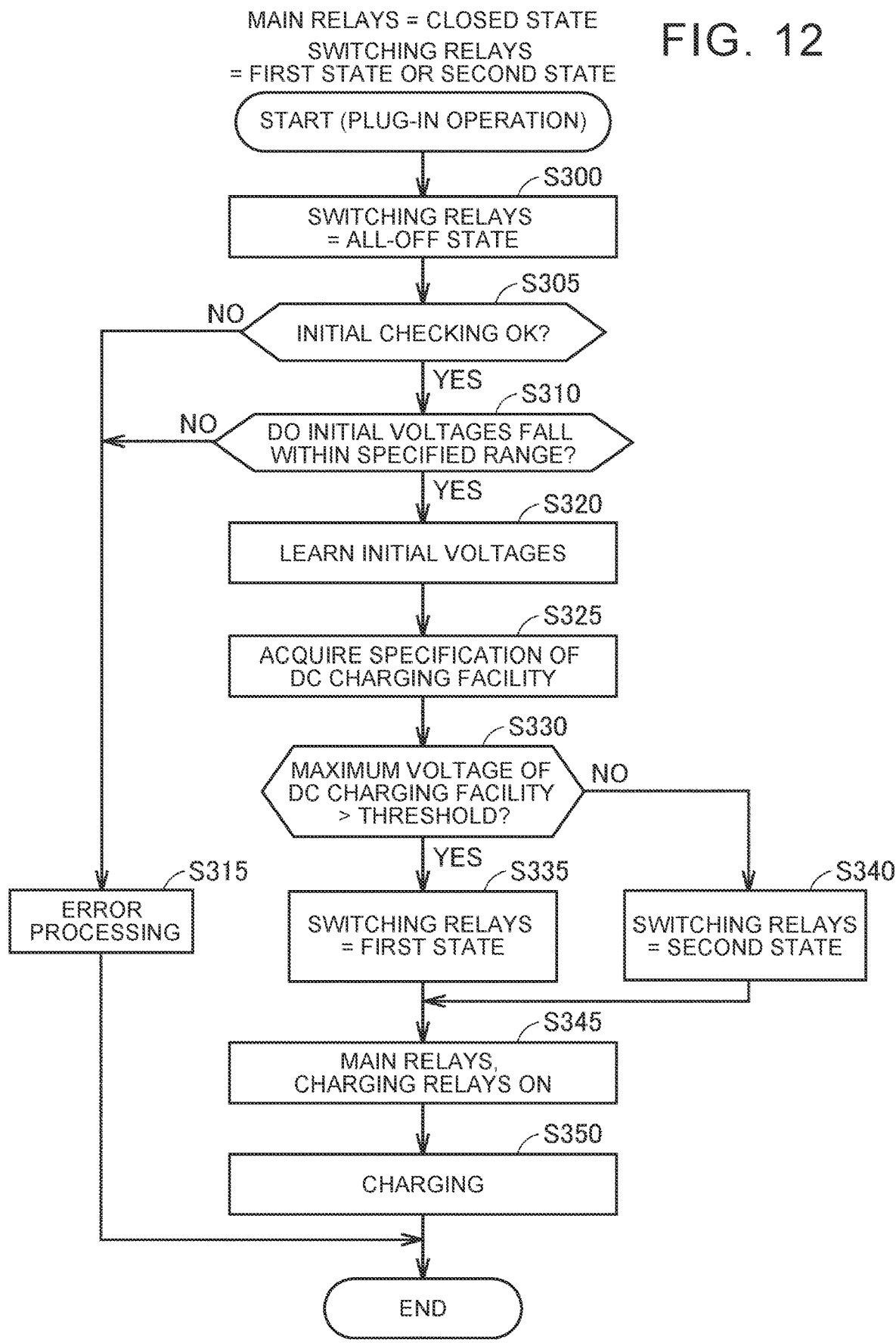
FIG. 12 is a flowchart (part 3) of processing that is executed by the ECU when the plug-in operation is performed.

FIG. 12 is a flowchart of processing that is executed by the ECU 100 when the plug-in operation is performed. This processing is executed every time the plug-in operation is performed for the vehicle 1. Note that the following description of FIG. 12 will be made on an example in which the plug-in operation is performed in the READY-ON state of the vehicle 1.

In the flowchart shown in FIG. 12, S300 is added to the flowchart in FIGS. 8, and S215 and S220 are eliminated from the flowchart in FIG. 8. Since the rest of steps in the flowchart shown in FIG. 12 are the same as those in the flowchart in FIG. 8, a description thereon will not be made.

Once the plug-in operation is performed, the ECU 100 brings the switching relays R1, R2, R3 into the all-off state (S300). When the vehicle 1 is in the READY-ON state, the switching relays R1, R2, R3 are either in the first state or in the second state. By the processing in S300, regardless of whether the switching relays R1, R2, R3 are in the first state or the second state, the switching relays R1, R2, R3 are switched to the all-off state with the plug-in operation being the trigger.

A reason why the discharge diagnosis is not made in Second Modified Example is that, in the case where the plug-in operation is performed in the READY-ON state, the use end operation is not performed, and thus the end voltages are not acquired. For this reason, the self-discharge amounts cannot be diagnosed.

As it has been described so far, in Second Modified Example, in the case where the plug-in operation is performed in the READY-ON state of the vehicle 1, the switching relays R1, R2, R3 are switched to the all-off state. In this way, when the initial checking and the diagnostic processing of the vehicle 1 are executed, the switching relays R1, R2, R3 are fixed in the all-off state. Accordingly, the voltage diagnosis can be made to diagnose the voltage between the terminals of each of the battery packs 11, 12, and the normal range can be set under the assumption that the diagnostic processing is executed for each of the battery packs 11, 12. Just as described, the diagnostic processing in the all-off state can be set as the precondition. Thus, compared to the case where the state of none of the switching relays R1, R2, R3 is determined in the diagnostic processing, accuracy of the diagnostic processing can be improved. In addition, since the diagnostic processing is made for each of the battery packs 11, 12, it is possible to identify the abnormal battery whose voltage between the terminals is out of the normal range. Furthermore, the switching relays R1, R2, R3 can be brought into the all-off state. Thus, when the abnormal battery is present, the battery pack can be replaced per pack unit.

It should be understood that the embodiment disclosed herein is illustrative in all respects and not restrictive. The scope of the present disclosure is defined by the claims rather than the description of the above embodiment, and intends to include all modifications falling within the claims and equivalents thereof.

What is claimed is:
1. An electric power storage system comprising:
an electric power storage device configured to be charged by receiving electric power supplied from a power supply on the outside of a vehicle, the electric power storage device including:
plural electric power storage bodies; and
a switching relay configured to be switched between a first state, a second state, and an all-off state, the first state being a state where the plural electric power storage bodies are connected in series, the second state being a state where the plural electric power storage bodies are connected in parallel, and the all-off state being a state in which the switching relay causes each of the plural electric power storage bodies to be electrically disconnected from the rest of the electric power storage bodies;
a main relay provided between the electric power storage device and an electrical load of the vehicle; and
a control unit configured to control charging of the electric power storage device, the control unit being configured to control the switching relay into the all-off state where the plural electric power storage bodies are electrically disconnected from each other when the main relay is in an opened state, and the control unit learns the voltages of the plural electric power storage bodies in the all-off state of the switching relay.

2. The electric power storage system according to claim 1, wherein
the control unit further controls the switching relay into the all-off state when the main relay is in a closed state and a preparation operation is performed to charge the electric power storage device.

3. The electric power storage system according to claim 1 further comprising:
plural voltage sensors, each of which detects a voltage corresponding to one of the plural electric power storage bodies, wherein
the control unit is configured to permit the electric power storage device to be charged by the power supply in a case where, each of the voltages of the plural electric power storage bodies falls within a specified range when the switching relay is in the all-off state.

4. The electric power storage system according to claim 3, wherein
the specified range is defined by the learned voltages.

5. The electric power storage system according to claim 1 further comprising:
plural voltage sensors, each of which detects a voltage corresponding to one of the plural electric power storage bodies, wherein
when, of the plural electric power storage bodies, an abnormal electric power storage body whose voltage does not fall within a specified range in the all-off state of the switching relay is present, the control unit is configured to control the switching relay such that the abnormal electric power storage body of the plural electric power storage bodies of the electric power storage device is disconnected from the power supply, and causes a non-abnormal electric power storage body of the electric power storage device to be charged by the power supply.

6. The electric power storage system according to claim 1, wherein
when initiating charging of the electric power storage device by the power supply, the control unit brings the switching relay into the first state.

7. The electric power storage system according to claim 1, wherein
the electric power storage bodies are secondary batteries, and
when, of the plural electric power storage bodies, the electric power storage body whose electric power storage amount is smaller than a prescribed value is present at initiation of charging of the electric power storage device by the power supply, the control unit is configured to control the switching relay such that the electric power storage body whose electric power storage amount is smaller than the prescribed value is connected to the power supply and that the electric power storage body whose electric power storage amount is equal to or larger than the prescribed value is disconnected from the power supply.

* * * * *

UNITED STATES PATENT AND TRADEMARK OFFICE
CERTIFICATE OF CORRECTION

PATENT NO. : 10,974,617 B2
APPLICATION NO. : 16/251700
DATED : April 13, 2021
INVENTOR(S) : Yoshihiko Hiroe and Yoshitaka Niimi It is certified that error appears in the above-identified patent and that said Letters Patent is hereby corrected as shown below:

In the Specification

In Column 1, Line(s) 27, delete "ore of a fa it" and insert --one of a first--, therefor.

In Column 1, Line(s) 29, after "state", delete "v" and insert --where--, therefor.

In Column 1, Line(s) 31, after "(SOC)", insert --,--.

In Column 3, Line(s) 39, after "when", insert --,--.

In Column 4, Line(s) 37, after "elements", insert --,--.

In Column 4, Line(s) 52, delete "tine" and insert --time--, therefor.

In Column 4, Line(s) 66, after "executed", delete "b" and insert --by--, therefor.

In Column 5, Line(s) 15, delete "if" and insert --of--, therefor.

In Column 5, Line(s) 16, delete "over" and insert --power--, therefor.

In Column 5, Line(s) 21, after "40", insert --,--.

In Column 5, Line(s) 60, delete "tile" and insert --the--, therefor.

In Column 6, Line(s) 50, after "electrode", insert --line--.

In Column 7, Line(s) 24, delete "113" and insert --IB--, therefor.

In Column 9, Line(s) 21, delete "itis" and insert --it is--, therefor.

Signed and Sealed this
Twenty-seventh Day of July, 2021

Drew Hirshfeld
*Performing the Functions and Duties of the
Under Secretary of Commerce for Intellectual Property and
Director of the United States Patent and Trademark Office*

In Column 9, Line(s) 42, delete "11,," and insert --11,--, therefor.

In Column 9, Line(s) 66, after "current-carrying", delete "to".

In Column 10, Line(s) 12, after "storage", delete ",".

In Column 10, Line(s) 13, after "packs", insert --11, 12--.

In Column 10, Line(s) 23, after "T1", insert --,--.

In Column 11, Line(s) 33, after "unit", delete "," and insert --.--, therefor.

In Column 11, Line(s) 40, delete "1" and insert --R1--, therefor.

In Column 12, Line(s) 49, after "than a", delete "a".

In Column 13, Line(s) 47, delete "fails" and insert --falls--, therefor.

In Column 14, Line(s) 28, after "component", delete "," and insert --.--, therefor.

In Column 14, Line(s) 46, after "horizontal", delete ",".

In Column 14, Line(s) 47, delete "art" and insert --an--, therefor.

In Column 14, Line(s) 63, after "charging", delete ",".

In Column 16, Line(s) 14, after "packs", insert --11,--.

In Column 16, Line(s) 21, delete "tine" and insert --the--, therefor.

In Column 16, Line(s) 32, delete "at" and insert --of--, therefor.

In Column 16, Line(s) 51, delete "front" and insert --from--, therefor.

In Column 16, Line(s) 57, delete "V13" and insert --VB--, therefor.

In Column 17, Line(s) 3, after "shown", delete ",".

In Column 17, Line(s) 59, delete "FIGS." and insert --FIG.--, therefor.